(12) United States Patent
Trattler (10) Patent No.: US 9,442,142 B2
(45) Date of Patent: Sep. 13, 2016

(54) SENSOR ARRANGEMENT AND METHOD FOR OPERATION OF A SENSOR ARRANGEMENT

(75) Inventor: Peter Trattler, Graz (AT)

(73) Assignee: AMS AG, Unterpremstaetten (AT)

( * ) Notice: Subject to any disclaimer, the term of this patent is extended or adjusted under 35 U.S.C. 154(b) by 518 days.

(21) Appl. No.: 13/880,958

(22) PCT Filed: Oct. 25, 2011

(86) PCT No.: PCT/EP2011/068668
§ 371 (c)(1),
(2), (4) Date: Jul. 1, 2013

(87) PCT Pub. No.: WO2012/055874
PCT Pub. Date: May 3, 2012

(65) Prior Publication Data
US 2013/0278277 A1    Oct. 24, 2013

(30) Foreign Application Priority Data

Oct. 28, 2010 (DE) .................. 10 2010 049 962

(51) Int. Cl.
*G01R 27/26* (2006.01)
*H03K 17/955* (2006.01)
*H03K 17/96* (2006.01)

(52) U.S. Cl.
CPC ......... *G01R 27/2605* (2013.01); *H03K 17/955* (2013.01); *H03K 17/962* (2013.01); *H03K 2217/960725* (2013.01); *H03K 2217/960775* (2013.01)

(58) Field of Classification Search
CPC .. G01R 27/2605; G01R 27/26; G01R 27/02; H03K 17/955; H03K 17/962; H03K 17/9622; H03K 17/945; G01D 5/24; G01D 5/2405; B60R 21/01532
See application file for complete search history.

(56) References Cited

U.S. PATENT DOCUMENTS

| | | | | |
|---|---|---|---|---|
| 5,880,411 | A * | 3/1999 | Gillespie | G06F 3/03547 178/18.01 |
| 6,466,036 | B1 * | 10/2002 | Philipp | 324/678 |
| 6,703,845 | B2 * | 3/2004 | Stanley | B60N 2/002 280/735 |
| 7,098,644 | B1 * | 8/2006 | Denison | 324/72.5 |
| 7,436,299 | B2 * | 10/2008 | Shieh | G01B 7/14 180/271 |
| 7,667,468 | B1 | 2/2010 | Anderson | |
| 2005/0253712 | A1 * | 11/2005 | Kimura et al. | 340/562 |
| 2006/0250142 | A1 * | 11/2006 | Abe | 324/663 |
| 2007/0132559 | A1 * | 6/2007 | Schleeh | B60R 21/01532 340/425.5 |
| 2008/0287767 | A1 * | 11/2008 | Pasveer et al. | 600/372 |
| 2009/0027068 | A1 | 1/2009 | Philipp et al. | |

(Continued)

FOREIGN PATENT DOCUMENTS

WO    2007/054363 A2    5/2007

*Primary Examiner* — Minh N Tang
*Assistant Examiner* — David Frederiksen
(74) *Attorney, Agent, or Firm* — McDermott Will & Emery LLP (57) ABSTRACT

A sensor arrangement, in particular for a non-contacting measurement, comprises a signal generator (SRC) which is connected to a first electrode (EL1). A first detector (Det1) is connected to the first electrode (EL1), and is designed for a capacitive measurement by means of the first electrode (EL1). A second detector (Det2) is connected to a second electrode (EL2) and is designed to use the first and the second electrodes (EL1, EL2) to carry out a capacitive measurement. A method for operation of the sensor arrangement is likewise specified.

14 Claims, 4 Drawing Sheets

(56) References Cited

U.S. PATENT DOCUMENTS

| | | |
|---|---|---|
| 2009/0206851 A1 | 8/2009 | Chuang et al. |
| 2009/0224775 A1 | 9/2009 | Nishizono |
| 2009/0243633 A1 | 10/2009 | Brasseur et al. |
| 2010/0066391 A1 | 3/2010 | Hirasaka et al. |
| 2010/0073323 A1* | 3/2010 | Geaghan ................ G06F 3/044 345/174 |
| 2010/0117845 A1* | 5/2010 | Satz et al. ..................... 340/657 |
| 2010/0127717 A1 | 5/2010 | Cordeiro et al. |
| 2010/0219845 A1 | 9/2010 | Easter |
| 2010/0301880 A1* | 12/2010 | Stanley ............ B60R 21/01516 324/686 |

\* cited by examiner

SENSOR ARRANGEMENT AND METHOD FOR OPERATION OF A SENSOR ARRANGEMENT

The present invention relates to a sensor arrangement and to a method for operating a sensor arrangement, in particular for contactless measurement.

With the introduction of modern cell phones, smartphones and tablets, capacitive sensors are gaining increasing importance. Their use as proximity or touch sensors is widespread. In addition to the known implementations in display screens or touchscreens, it is possible, for example, to establish with capacitive sensors whether a user is holding a device in his hand or is actuating a switch at that time.

For the operation of capacitive sensors, in particular as proximity or touch sensors, capacitive couplings of detection electrodes with their surrounding environment play a particular role. For example, as an object approaches a suitable electrode, a capacitance is formed between the object and the electrode, and this capacitance can store a certain charge. This results in a characteristic current flow, which in turn indicates the capacitive coupling as a measured variable.

In this case, it is usually not only couplings of the electrodes to an object to be detected that need to be taken into consideration, but also couplings which describe the properties of the object itself (for example body capacitances) or further electrical component parts in a circuit (for example the grounding of a charger). In order to detect the measurement currents, additional capacitive couplings are used and thus result in further possible current paths through the entire system, depending on the capacitance value. Thus, an increased or decreased charge can be measured at an electrode. A common exemplary application occurs in the case of devices such as a cell phone or smartphone which is handheld by a user. Depending on whether the device is connected to a charger or not, a current path leads back via the grounded charger via the capacitive coupling and the user's body. This current path does not occur without a charger. Further possible grounding occurs, for example, in the case of connections of a device to a computer by means of serial bus systems such as USB (universal serial bus) or in the case of the use of an audio output with a stereo system. Even in these and similar application cases, it is often desirable for there to be reliable touch or proximity detection.

One object of the present invention consists of specifying a sensor arrangement and a method for operating a sensor arrangement which has increased measurement reliability.

This object is achieved by the independent claims. Developments and configurations are in each case the subject matter of the dependent claims.

In one embodiment, a sensor arrangement, in particular for contactless measurement, comprises a signal generator, which is connected to a first electrode. A first detector is likewise connected to the first electrode. A second detector is connected to a second electrode.

The first detector is designed for capacitive measurement by means of the first electrode with respect to a ground potential, for example. Similarly, the second detector is designed to implement a capacitive measurement by means of the first and second electrodes. In addition, the signal generator is connectable to the ground potential, for example.

The signal generator preferably provides a measurement current to the sensor arrangement. As a result of a capacitive coupling by means of the first electrode, a first capacitance is produced which is charged to a characteristic charge by means of the measurement current. If this is the case, the first detector measures a corresponding first signal, which characterizes the capacitive coupling. If the second electrode is now also capacitively coupled such that a further capacitance is also produced with the second electrode, the measurement current can flow both through the first electrode and through the second electrode. Correspondingly, the second detector measures a characteristic second signal at the second electrode and therefore indicates the capacitive coupling of the first and second electrodes. The first and second signals are furthermore also dependent on whether the capacitive coupling results in the possibility of the measurement current flowing back on a further path, for example via the signal generator and the coupling thereof to the ground potential.

The proposed sensor arrangement has a high degree of measurement reliability. In particular, the detection can be realized by means of the first and second detectors along different detection paths and can thus increase in reliability. In this way, the detection is largely independent of the usually unknown capacitance values. Furthermore, it is possible to distinguish the selected current paths in the sensor arrangement from one another by virtue of, for example, the first and second signals being compared in a suitable manner. In this case, the sensor arrangement is not restricted to two electrodes.

It may furthermore be advantageous to provide more than two electrodes, for example in order to be able to measure further capacitive couplings. The preceding and following embodiments relating to the sensor arrangement can be transferred similarly to these further electrodes.

In a further embodiment, the first detector is designed to measure the first signal at the first electrode, wherein the first signal is indicative of a capacitive coupling of an object to the first electrode. In addition, the second detector is designed to measure the second signal at the second electrode, wherein the second signal is indicative of a capacitive coupling of the object to the first and second electrodes.

In each case a characteristic capacitance is formed by capacitive coupling between the object and the first or second electrode. As a first approximation, these capacitances are characterized by the distance between the first or second electrode and the object. The electrode and the object in this sense to a certain degree form a plate capacitor. Where this specification makes reference to contactless measurement, this should be understood to mean that the electrodes themselves are not touched but the mentioned distance is retained. The object is characterized by its property of being able to couple capacitively. If a person forms this object, said person generally has a characteristic body capacitance to ground potential.

Depending on the capacitive coupling and further possible couplings by means of the body capacitance, the measurement current follows different detection paths and charges the capacitances linked to the electrodes differently. Corresponding to the charges at the first and/or second electrodes, the first and second signals are produced. The first and second signals therefore give information on the capacitive couplings and the dominant detection paths in the sensor arrangement.

In accordance with a further embodiment, the first detector is designed to measure, by means of a reference signal, whether the signal generator is connected to the ground potential.

The signal generator can be connected to the ground potential. This is the case in a typical application, for example, when a charger is connected to a device which comprises the sensor arrangement. By capacitive coupling of the signal generator to the ground potential, a detection path is opened up which leads back to the first electrode via the object and the signal generator. This can be measured by comparison with the reference signal. The magnitude of the reference signal is in principle adjustable and can be preset in accordance with the user's experience.

In accordance with a further embodiment, the first and second detectors each comprise at least one detection amplifier. The first signal and a first reference signal can be supplied at the at least one detection amplifier of the first detector. The detection amplifier provides a first detection signal depending on the first signal and the first reference signal.

The second signal and a second reference signal can be supplied at the at least one detection amplifier of the second detector. The detection amplifier provides a second detection signal depending on the second signal and the second reference signal.

In accordance with a further embodiment, the first electrode is connected to the first detector and the signal generator by means of a first switch. The signal generator is additionally connected to the second detector by means of a second switch. For this purpose, the second detector has a further detection amplifier, to which the second signal and a third reference signal can be supplied. The further detection amplifier provides a third detection signal depending on the second signal and the third reference signal.

In principle, it is possible and provided for only one of the electrodes or the first and second electrode to couple capacitively. However, it may be necessary for there to be proximity or touch detection only when both the first and the second electrode couple capacitively. This is made possible by suitable switching sequences of the first and second switches. A possible switching sequence comprises, for example, switching of only the first, switching of only the second and then switching of the first and second switches together. It is possible to clearly determine from the signals measured at the detection amplifiers whether both the first and second electrodes couple capacitively.

It may furthermore be advantageous to provide a third switch, which connects the further detection amplifier optionally to the second signal. In this way, switching sequences can be realized which successively call up the detection amplifiers used individually for the measurement of a capacitive coupling.

In a further embodiment, the first and/or second detectors are coupled to a charge measurement apparatus. The charge measurement apparatus provides the first or second signal.

The charges or currents that can be measured by means of the first and second electrodes are generally very low. It is therefore advantageous to amplify the first and second signals by means of the charge measurement apparatus.

In accordance with a further embodiment, the charge measurement apparatus has an integrator. A first measurement reference is present at the integrator, and the first or second signal is supplied to the first or second detector by means of an output. A first measurement switch couples either an input of the integrator or a second measurement reference to the first or second electrode.

In order to amplify the first and/or second signal, the integrator is charged within successive measurement cycles. The measurement cycles proceed depending on the first measurement switch and the first and second measurement reference. In this way, the first or second signal is amplified stepwise and scaled with a characteristic capacitance of the integrator.

In accordance with a further embodiment, a flipflop is connected to a first and a second auxiliary amplifier on the input side. In this case, the first measurement reference is present at the first auxiliary amplifier and the second measurement reference is present at the second auxiliary amplifier. The flipflop provides an output signal on the output side which can be supplied to the first or second detector. A second measurement switch is controllable by means of the output signal in such a way that the second measurement switch connects either a first or second constant current source electrically to inputs of the first and second auxiliary amplifier and thus couples to the first or second electrode.

The flipflop of the charge measurement apparatus is operated cyclically. For this purpose, the first or second electrode is first charged to the first reference by means of the first constant current source and the second measurement switch. Then, the output signal is adjusted at the flipflop in such a way that the second measurement switch switches to the second constant current source. Thereupon, discharge is performed by means of the first or second electrode and the second constant current source until the second reference is reached. Then, the output signal is adjusted at the flipflop in such a way that the second measurement switch in turn switches to the first constant current source.

The output signal of the flipflop has the dimension of a frequency at which the second measurement switch switches between the first and second constant current sources. This frequency is proportional to the capacitance of a capacitive coupling and therefore enables a capacitive or proximity measurement. In addition, the measurement can be scaled with the aid of the constant current sources.

In accordance with a further embodiment, the flipflop is connected to the first and second auxiliary amplifiers on the input side. In this case, the first measurement reference is present at the first auxiliary amplifier and the second measurement reference is present at the second auxiliary amplifier. The flipflop provides an output signal on the output side. In addition, a phase-locked loop is provided, to which the output signal and a control reference can be supplied. The phase-locked loop provides a closed-loop control signal, which is supplied to the first or second detector. The first and second adjustable current sources are then each adjustable in terms of their current intensity by means of the closed-loop control signal.

The phase-locked loop additionally regulates the now adjustable current sources in such a way that the output signal of the flipflop corresponds to the control reference. Therefore, the second measurement switch is switched at a constant frequency. If this state is set, the current intensities of the first and second adjustable current sources are proportional to the capacitance of a capacitance coupled to the first and/or second electrode. Owing to the closed-loop control character of the phase-locked loop, interference as a result of environmental influences can be effectively compensated for.

In accordance with a further embodiment, the first and/or second electrode comprises a capacitive shield.

The capacitive shield serves to protect the electrodes from parasitic capacitances, as may occur, for example, in electronic conductor tracks and areas. These appear, for example, as interference currents which would influence any capacitance measurement. Preferably, the interference currents are dissipated by means of the capacitive shield.

In accordance with a further embodiment, the capacitive shield has voltage tracking.

The voltage tracking tracks the respective voltage present at the electrodes and compensates for voltage fluctuations as a result of parasitic capacitances. In this way, interference currents are prevented from arising at the respective electrodes.

In accordance with a further embodiment, at least one further electrode is provided. A fourth detector for capacitive measurement is associated with this further electrode.

One embodiment of a method for operating a sensor arrangement, in particular for contactless measurement, initially comprises providing a signal current. A first capacitive measurement is implemented by means of a first electrode with respect to a ground potential. A second capacitive measurement is implemented by means of the first electrode and a second electrode.

The proposed method for operating a sensor arrangement has a high degree of measurement reliability. In particular, the detection by means of the first and second electrodes can be realized along different detection paths and therefore can be increased in terms of reliability. In this way, the detection is largely independent of usually unknown capacitance values. Furthermore, it is possible to distinguish the selected current paths from one another by virtue of, for example, the first and second signals being compared in a suitable manner. In this case, the method is not restricted to two electrodes.

In accordance with a further embodiment of the method, a first signal is measured by means of a first detection path, which signal is indicative of a capacitive coupling of an object to the first electrode. A second signal is measured by means of a second detection path. This second signal is indicative of a capacitive coupling of the object to the first and second electrodes.

In a further embodiment, the results of the first and second capacitive measurements are used for mutual calibration.

With the aid of the first and second signals, the detection paths within the sensor arrangement can be assessed. For example, information can be gleaned in respect of whether and to what degree there is a capacitive coupling to the ground potential.

The invention will be explained in more detail below using a plurality of exemplary embodiments with reference to figures. Where circuit elements or components correspond to one another in terms of their function, the description thereof will not be repeated in any of the subsequent figures.

Figure 1:
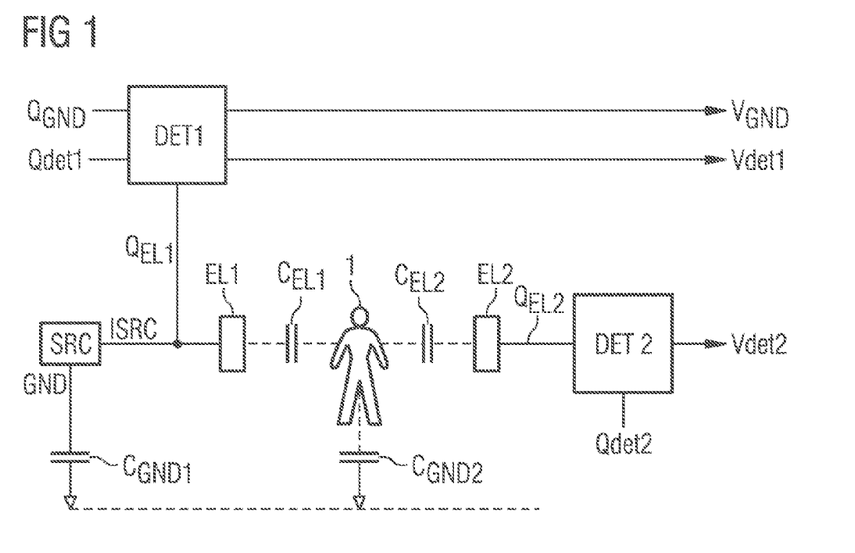
FIG. 1 shows an exemplary embodiment of a sensor arrangement in accordance with the proposed principle.

FIG. 1 shows an exemplary sensor arrangement in accordance with the proposed principle. The sensor arrangement comprises a first and a second detector DET1, DET2. The first and second detectors DET1, DET2 are each designed for a capacitive proximity or touch measurement. For this purpose, the first detector DET1 is connected to a first electrode EL1 and the second detector DET2 is connected to a second electrode EL2, by means of which the respective measurement takes place. Furthermore, a signal generator SRC is connected to the first electrode EL1.

Proximity or touch measurements in respect of an object 1 can be measured contactlessly by means of the first or second electrode EL1, EL2 with the sensor arrangement. In this case, the electrodes are integrated, for example, in a mobile terminal such as a cell phone, smartphone or similar device. The object 1 can be coupled capacitively to the electrodes EL1, EL2 on different detection paths. The object 1 can be represented, for example, by a human body, for example a hand or a finger, and can be described by a characteristic capacitance CGND2.

By virtue of the object 1 approaching or touching, for example, a housing of a mobile terminal or switch, capacitances CEL1, CEL2 are formed at the first and/or second electrodes EL1, EL2. The respective capacitance can in this case be characterized by a distance d between the electrode EL1, EL2 and the object 1, which as it were form the plates of a capacitor. This is illustrated in FIG. 1 by the characteristic capacitances CEL1, CEL2. The object 1, for example, the body or body part of a person, is generally coupled capacitively with the characteristic capacitance CGND2 to the ground potential GND. If, in addition, the signal generator SRC, for example the charger or the supply battery of a mobile terminal, is likewise coupled capacitively by means of a capacitance CGND1 to the ground potential GND, the first detection path is closed, which first detection path thus leads from the signal generator SRC back to the first electrode EL1.

Depending on a current ISRC made available by the signal generator SRC, a characteristic current flows along the first detection path, which characteristic current indicates the proximity or touch of the object 1. The detection of this proximity takes place by means of the first detector DET1. The first detector DET1 alternatively measures the current flowing through the first electrode EL1 or the charge stored in the capacitance CEL1 in the form of a first signal QEL1. This first signal QEL1 is supplied to the first detector DET1. In this as well as the following figures, in each case a current or charge measurement which is characterized by the first signal QEL1, for example, is denoted by a circle.

In addition, a first reference signal QDET1 is present at the first detector DET1, with it being possible for the first signal QEL1 to be compared with said first reference signal. As a result of this comparison, for example by means of suitable amplifiers or comparators, the first detector DET1 provides a characteristic signal VDET1, which indicates the proximity of the object 1 for further processing.

Furthermore, it is additionally possible to establish, with the aid of the first detector DET1, whether the signal generator SRC is connected to the ground potential GND. For this purpose, a second reference QGND is present at the first detector DET1, for example, which second reference is likewise compared with the first signal QEL1. As a result of this comparison, the first detector DET1 provides a further signal VGND, which indicates whether the signal generator SRC is connected to the ground potential GND or not. The signal level of the references QDET1, QGND are selectable and adjustable as proximity variables.

A second detection path leads from the signal generator SRC via the first electrode EL1 and the object 1 to the second electrode EL2 and the second detector DET2. By virtue of the object 1 touching at the first electrode EL1 and the second electrode EL2, a first and second characteristic capacitance CEL1, CEL2 is measured with the aid of the second detector DET2. For this purpose, the current ISRC provided by the signal generator SRC flows through the first electrode EL1 to the second electrode EL2. The second detector DET2 measures a second signal QEL2 at the second electrode EL2, which is proportional to the charge at the capacitance CEL2. The second signal QEL2 is compared with a second reference QDET2 by means of the second detector DET2. Thereupon, the second detector DET2 provides a comparison signal VDET2, which indicates whether the object 1 has approached the electrodes EL1, EL2 or not.

With the aid of the proposed sensor arrangement, therefore, at least two detection paths for proximity or touch detection are possible. Which of the detection paths is dominant in a specific application is dependent on the capacitances CGND1, CGND2. If the capacitances CGND1 and CGND2 are high in value, this is indicated by the signal VDET1 since the current which is flowing through the first electrode EL1 will increase in comparison with the current ISRC. This is particularly the case when, for example in a battery-operated system, the signal generator SRC is connected to a charger and therefore to the ground potential GND. In other words, a current is flowing in the first detection path back to the electrode EL1 and is superimposed on the signal current ISRC. If, on the other hand, the capacitances CGND1 and CGND2 are low in value, and for example the charger is not connected, proximity and touch can be indicated by the second detector DET2 by means of the second signal VDET2. The current ISRC is now flowing through the first electrode EL1 to the second electrode EL2 and results in the second signal QEL2 described.

The described sensor arrangement has a higher degree of reliability for the measurement of proximity and touch for example of a mobile terminal in which the circuit is integrated. It can be used in particular in systems which are either grounded or ungrounded. In addition, it is possible to distinguish between a grounded and an ungrounded state of the system. For this purpose, the reference signals present at the first detector DET1 are different and are adjusted in a targeted manner in accordance with the respective application. For example, the following may apply:

QREF>QDET1.

The sensor arrangement in accordance with the proposed principle is illustrated here for in each case two electrodes. The proposed principle can easily be generalized to more than two electrodes, however. For this purpose, further detectors need to correspondingly be associated with the additional electrodes. The considerations and statements set forth in this specification can be transferred analogously to the further electrodes and detectors.

Figure 2:
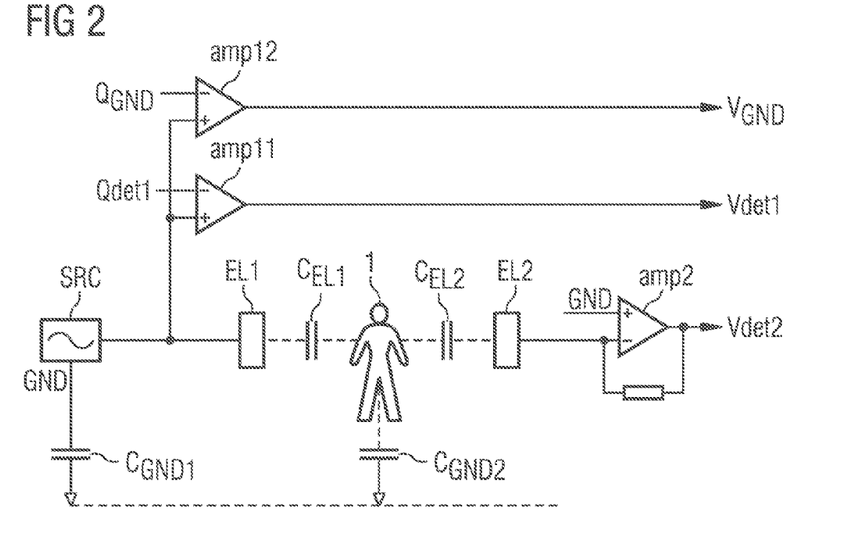
FIG. 2 shows a further exemplary embodiment of a sensor arrangement in accordance with the proposed principle.

FIG. 2 shows a further exemplary embodiment in accordance with the proposed principle. In supplementary fashion to the sensor arrangement shown in FIG. 1, the first and second detectors DET1, DET2 are further embodied with the aid of amplifiers. In this example, the first detector DET1 comprises a first and second detection amplifier AMP11, AMP12. In this case, the first reference QDET1 is present at the first detection amplifier AMP11 and the reference QGND is present at the second detection amplifier AMP12. Both detection amplifiers AMP11, AMP12 are connected to the first signal QEL1. The first detection amplifier AMP11 provides the signal VDET1 and the second amplifier AMP12 provides the signal VGND. The second detector DET2 comprises, for example, a third detection amplifier AMP2, whose first input is connected to the second signal QEL2 and is coupled to an output of the amplifier AMP2 via a resistor R1. The second reference QDET2, which corresponds to the ground potential GND, for example, is present at a second input of the detection amplifier AMP2.

Figure 3:
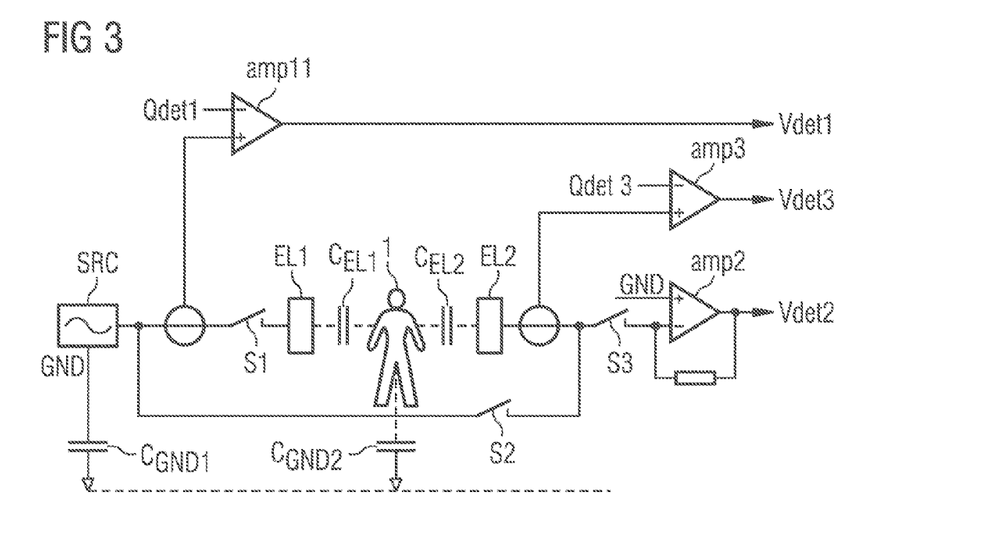
FIG. 3 shows a further exemplary embodiment of a sensor arrangement in accordance with the proposed principle.

FIG. 3 shows a further exemplary embodiment of a sensor arrangement in accordance with the proposed principle. The figure shows the sensor arrangement on the basis of FIG. 2, wherein the second amplifier AMP12 in the first detector DET1 is not shown for reasons of clarity. As a deviation from and supplementary to FIG. 2, the first electrode EL1 is coupled to the signal generator SRC and the first detector DET1 by means of a first switch S1. In addition, a second switch S2 leads the signal generator SRC to the connecting line of the second electrode EL2 and to the first input of the amplifier AMP2. Furthermore, a third amplifier AMP3 is connected with a first input, by means of a third switch S3, to the second signal QEL2 or the second electrode EL2. A third reference QDET3 is present at a second input of the third amplifier AMP3. The third amplifier AMP3 provides a third detection signal VDET3.

With the aid of the first, second and third switches S1, S2, S3, different switch positions can be realized and parts of the sensor arrangement can be electrically conductively connected. In this way, it is possible to establish, by suitable switching sequences, whether the object 1 is capacitively coupled to one or both electrodes EL1, EL2.

If, for example, only the first switch S1 is closed, a current is flowing through the first electrode EL1. If the object 1 now only touches the first electrode EL1, the first signal QEL1 can be measured only with the aid of the first detector DET1. If, however, the object 1 is also touching the second electrode EL2, the second signal QEL2 can additionally be measured at the second electrode EL2 with the aid of the second and third detectors DET2, DET3. This takes place with the aid of the second amplifier AMP2 and the third amplifier AMP3.

If only the second switch S2 is closed, the second and third detectors DET2, DET3 measure the current ISRC as reference.

If, however, both switches S1, S2 are closed, the second and third detectors DET2, DET3 measure different signals QEL2, depending on whether the object 1 is capacitively coupled to the two electrodes EL1, EL2.

The detection of charges or current flow through the electrodes is performed separately for each of the two electrodes EL1, EL2 with the aid of the first and second switches S1, S2 and the closed third switch S3. In this way, it is possible to achieve a situation in which proximity or touch detection of the object 1 with respect to the electrodes only takes place when both electrodes together are touching or nearby. This is advantageous, for example, for proving whether a, for example, mobile terminal is being held in the hand of its user.

Figure 4:
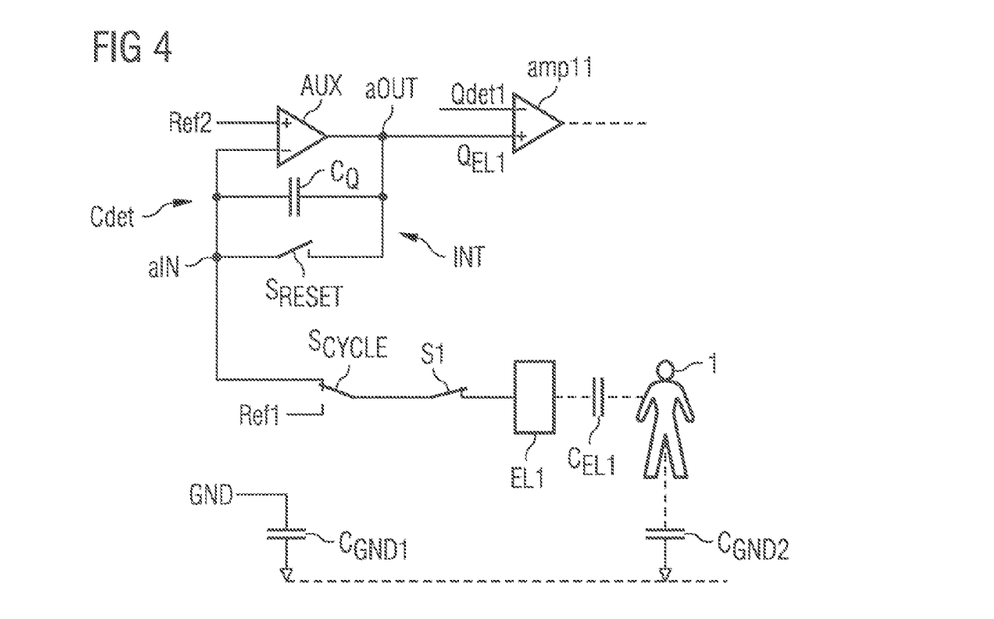
FIG. 4 shows an exemplary charge measurement apparatus in accordance with the proposed principle.

FIG. 4 shows an exemplary charge measurement apparatus in accordance with the proposed principle. The figure shows, by way of example, the first detector DET1 with the first detection amplifier AMP11 and the first reference signal QDET1. The first signal QEL1 is supplied to the detection amplifier AMP11 by means of the charge measurement apparatus CDET. The charge measurement apparatus CDET comprises, for this purpose, an integrator INT. The integrator INT has an auxiliary amplifier AUX, whose first input is connected to an output via a capacitance CQ. A reset switch SRESET likewise connects the output to the input of the auxiliary amplifier AUX. The input is additionally electrically conductively connectable to the first electrode EL1 via a further switch SCYCLE. The measurement switch SCYCLE is additionally connectable to a first measurement reference REF1. A second measurement reference REF2 is present at a second input + of the auxiliary amplifier AUX.

Different measurement steps can be implemented with the aid of the charge measurement apparatus CDET on the basis of the integrator INT, which measurement steps have the aim of amplifying the first signal QEL1. For this purpose, first the measurement capacitance CQ is discharged by closing the reset switch SRESET. As a result, the measurement switch SRESET is then open. In a subsequent step, the measurement switch SCYCLE is first connected to the measurement reference 1. If, for example, the object 1 now approaches the electrode 1, a current, which corresponds to the measurement reference REF1, flows via the first electrode 1 to the coupling capacitance CEL1, via the object 1 with a capacitance CGND2 and, when the charger is connected, via the capacitance CGND1. The sum of said capacitances is thus charged to the measurement reference 1:

$$REF1 \propto \left(\frac{1}{C_{EL1}} + \frac{1}{C_{GND1}} + \frac{1}{C_{GND2}}\right)^{-1}.$$

In a subsequent step, the measurement switch SCYCLE is switched to the input of the auxiliary amplifier AUX, for example an operational amplifier. As a result, the capacitance CEL1 and, when the object 1 is touching, also the body capacitance CGND2 are charged to the second measurement reference REF2. In this way, a current is produced which is proportional to the difference of the measurement references:

$$I_Q \propto (REF2 - REF1) \cdot \left(\frac{1}{C_{EL1}} + \frac{1}{C_{GND1}} + \frac{1}{C_{GND2}}\right)^{-1}.$$

This current IQ is integrated with the measurement capacitance CQ by virtue of the corresponding currents being generated in different successive cycles by means of the measurement switch SCYCLE and being added correspondingly to the measurement capacitance CQ.

Thus, the first signal QEL1 is generated stepwise as a voltage VQ, which is proportional to the capacitance at the first electrode EL1. This is scaled by the proportionality factor in accordance with the capacitance of the measurement capacitance CQ.

Figure 5:
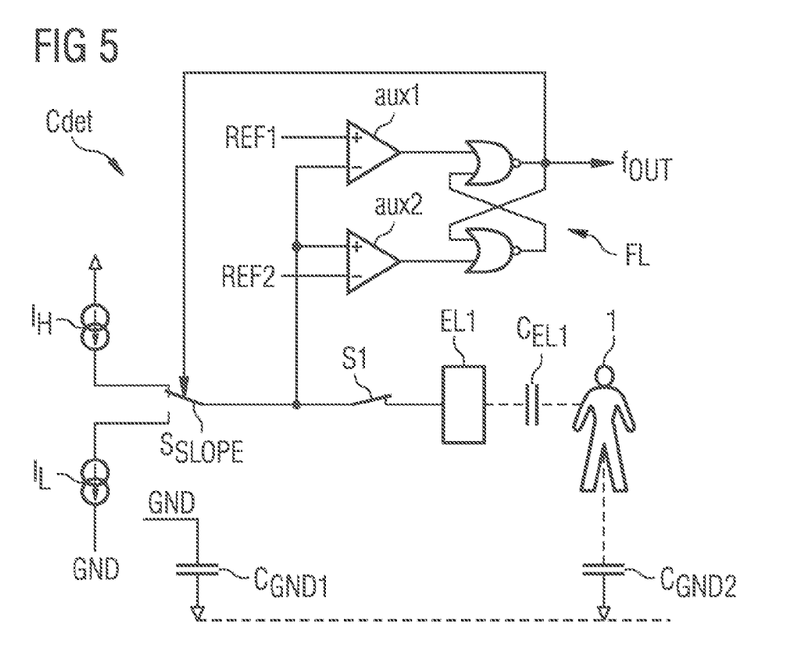
FIG. 5 shows a further exemplary charge measurement apparatus in accordance with the proposed principle.

FIG. 5 shows a further exemplary embodiment of a charge measurement apparatus. Said figure shows a further charge measurement apparatus CDET, which is designed, for example, for measurement with the first electrode EL1. A bistable flipflop FL is connected to a first and a second auxiliary amplifier AUX1, AUX2 on the input side. In each case the first and second measurement references REF1, REF2 are present at inputs of the first and second auxiliary amplifier AUX1, AUX2. Two further inputs of the first and second auxiliary amplifiers AUX1, AUX2 are connected to one another in such a way that they are connected to the first electrode EL1 and a further measurement switch SSLOPE.

The flipflop FL provides an output signal fOUT, which can be supplied to the first detector DET1, for example, on the output side. The output signal fOUT is also fed back to the further measurement switch SSLOPE and used for controlling said measurement switch. Either a first constant current source IH or a second constant current source IL can be electrically conductively connected to the first electrode EL1 depending on the output signal fOUT. These current sources IH, IL are then alternatively likewise switched to the inputs of the auxiliary amplifiers AUX1, AUX2.

By way of example, the proposed charge measurement apparatus CDET can be used as follows. First, the first electrode EL1 is charged with the aid of the first constant current source IH until it has a charge corresponding to the first measurement reference REF1. Switching the measurement switch SSLOPE over to the second constant current source IL results in the first electrode EL1 being discharged until it has a charge corresponding to the second measurement reference REF2. If this is the case, the described cycle starts anew by virtue of the measurement switch SSLOPE switching over to the first current source IH.

The output signal fOUT of the flipflop has the dimension of a frequency and describes the cyclic charging and discharging of the first electrode EL1. The output signal fOUT is thus indirectly proportional to the capacitance at the first electrode EL1. The constant current sources IH and IL also enable scaling of the charge stored in the capacitance or first electrode EL1.

Figure 6:
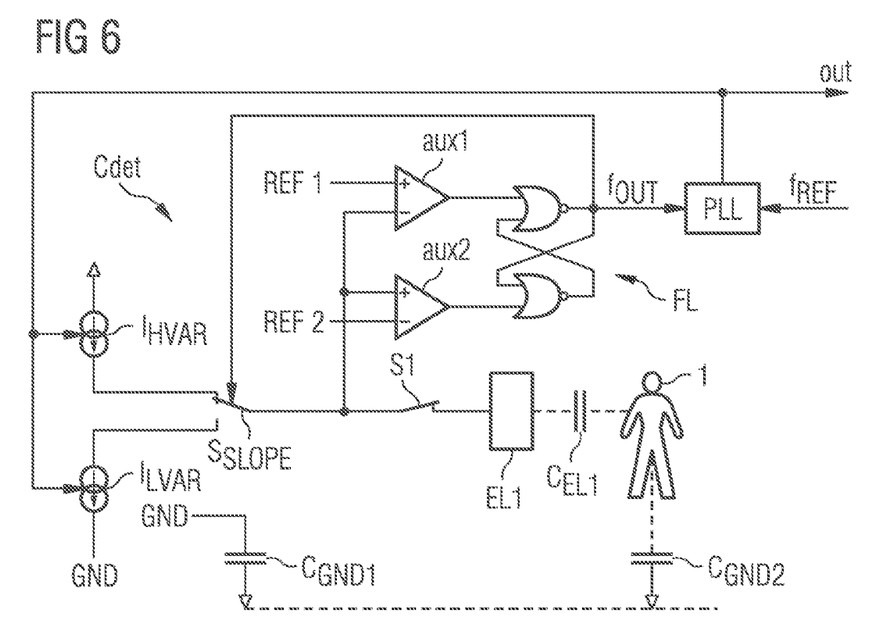
FIG. 6 shows a further exemplary charge measurement apparatus in accordance with the proposed principle.

FIG. 6 shows a further exemplary embodiment of a charge measurement apparatus. The circuit in FIG. 6 is based on the circuit shown in FIG. 5. In this case, the output signal fOUT of the flipflop is supplied to a phase-locked loop PLL together with a phase reference (clock reference) fREF. The phase-locked loop PLL serves the purpose of achieving a constant operational frequency of the measurement cycles, i.e. fOUT=const.

For this purpose, the phase-locked loop PLL is connected to control lines at now adjustable first and second current sources IHvar and ILvar, which replace the constant current source IH, IL. The phase-locked loop PLL regulates the current intensity of the adjustable current sources IHvar and ILvar in such a way that fOUT=fREF holds true. The current intensities of the adjustable current sources IH, IL thus represent the instantaneous charge which is stored by means of the first electrode EL1. The phase-locked loop PLL provides a characteristic output signal OUT to the first detector DET1, for example. This embodiment is advantageous if the operation of the circuit at a constant frequency is desired.

Figure 7:
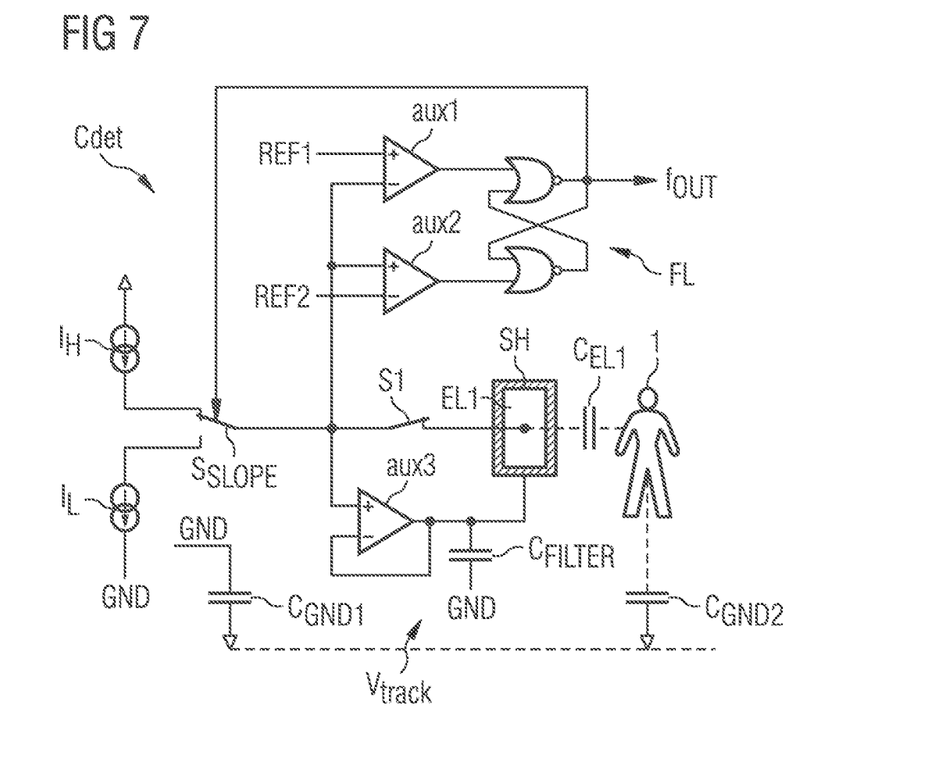
FIG. 7 shows an exemplary capacitive shielding apparatus for an electrode in accordance with the proposed principle.

FIG. 7 shows an exemplary capacitive shielding apparatus for an electrode in accordance with the proposed principle. FIG. 7 shows the circuit shown in FIG. 5 and is additionally supplemented by a shielding apparatus SH around the first electrode EL1. This serves the purpose of shielding parasitic capacitances from the surrounding environment of the first electrode EL1. The shield SH, as in this example, can further be provided with voltage tracking. For this purpose, the shield SH is connected, with a smoothing filter CFILTER, to the ground potential GND. In addition, the shield SH and the smoothing filter CFILTER are connected to the first switch S1 and the measurement switch SSLOPE by means of an auxiliary amplifier AUX3.

Parasitic capacitances between the first electrode and the shield SH are not influenced by the capacitive measurement. The voltage present at the shield SH is kept at a voltage which corresponds to the first electrode EL1 by means of the voltage tracking. In this way, parasitic capacitances cannot generate a disruptive additional current.

The embodiments set forth in the preceding figures and explained have been formulated predominantly with reference to the first electrode EL1 and corresponding to the first detector DET1, for reasons of clarity. However, the statements and explanations can also be transferred in analogous form to further electrodes and detectors in accordance with the proposed principle, i.e. in particular to the second electrode and the second detector DET2.

In a further embodiment (not shown), the sensor arrangement comprises a multiplicity N of electrodes. As explained in connection with FIGS. 1 to 7, each of the N electrodes has an associated detector for capacitive measurement.

LIST OF REFERENCE SYMBOLS

Object
aIN Input
amp11 Amplifier
amp12 Amplifier
amp2 Amplifier
amp3 Amplifier
aOUT Output
aux1 Auxiliary amplifier
aux2 Auxiliary amplifier
aux3 Auxiliary amplifier
CDET Charge measurement apparatus
CEL1 Capacitance
CEL2 Capacitance
CFILTER Smoothing capacitance
CGND1 Capacitance
CGND2 Capacitance
CQ Capacitance integrator
EL1 First electrode
EL2 Second electrode
FL Flipflop
fOUT Output signal flipflop
fREF Reference signal flipflop
GND Ground potential
ICH Constant current source
IHvar Adjustable current source
IL Constant current source
ILvar Adjustable current source
INT Integrator
OUT Output signal
PLL Phase-locked loop
QDET1 Reference
QDET2 Reference
QDET3 Reference
QEL1 First signal
QEL2 Second signal
QGND Reference
REF1 Reference
REF2 Reference
S1 Switch
S2 Switch
S3 Switch
SCYCLE Switch
SH Shield
SSLOPE Switch
SRC Signal generator
SRESET Switch
VDET1 Detection signal
VDET2 Detection signal
VDET3 Detection signal

The invention claimed is:

1. A sensor arrangement, in particular for contactless measurement, comprising:
a signal generator, which is connected to a first electrode;
a first detector, which is connected to the first electrode, and which is designed to measure a first signal and for a capacitive measurement by means of the first electrode; and
a second detector, which is connected to a second electrode, and which is designed to measure a second signal and to perform a capacitive measurement by means of the first and second electrodes,
wherein the first electrode is connected to the first detector and the signal generator by means of a first switch,
wherein the signal generator is connected to the second detector by means of a second switch, and
wherein the second detector has a further detection amplifier, to which the second signal and a third reference signal can be supplied, and which detection amplifier provides a third detection signal depending on the second signal and the third reference signal.

2. The sensor arrangement according to claim 1, wherein the first detector is designed to measure the first signal at the first electrode,
wherein the first signal is indicative of a capacitive coupling of an object to the first electrode, and
wherein the second detector is designed to measure the second signal at the second electrode, wherein the second signal is indicative of a capacitive coupling of an object to the first and second electrodes.

3. The sensor arrangement according to claim 1 or 2, wherein the first detector is designed to measure, by means of a reference signal, whether the signal generator is connected to a ground potential.

4. The sensor arrangement according to claim 1, wherein the first and second detectors each comprise at least one detection amplifier,
wherein the first signal and a first reference signal can be supplied at the at least one detection amplifier of the first detector, and which detection amplifier provides a first detection signal depending on the first signal and the first reference signal, and
wherein the second signal and a second reference can be supplied at the at least one detection amplifier of the second detector, and which detection amplifier provides a second detection signal depending on the second signal and the second reference signal.

5. The sensor arrangement according to claim 1, wherein the first or second detector is/are coupled to a charge measurement apparatus, and
wherein the charge measurement apparatus provides the first or second signal.

6. The sensor arrangement according to claim 5, wherein the charge measurement apparatus has an integrator, at which a first measurement reference is present and which supplies the first or second signal to the first or second detector by means of an output, and
wherein a first measurement switch couples either an input of the integrator or a second measurement reference to the first or second electrode.

7. The sensor arrangement according to claim 1, wherein the first or second electrode is surrounded by a capacitive shield.

8. The sensor arrangement according to claim 7, wherein the capacitive shield has voltage tracking.

9. The sensor arrangement according to claim 1, wherein at least one further electrode is provided, and
wherein the at least one further electrode has an associated third detector for capacitive measurement.

10. A sensor arrangement, in particular for contactless measurement, comprising:
a signal generator, which is connected to a first electrode;

a first detector, which is connected to the first electrode, and which is designed to measure a first signal and for a capacitive measurement by means of the first electrode; and a second detector, which is connected to a second electrode, and which is designed to measure second signal and to perform a capacitive measurement by means of the first and second electrodes, wherein the first or second detector is/are coupled to a charge measurement apparatus, wherein the charge measurement apparatus provides the first or second signal, and wherein the charge measurement apparatus comprises:
  a flipflop, which is connected on the input side to a first and a second auxiliary amplifier, wherein a first measurement reference is present at the first auxiliary amplifier and a second measurement reference is present at the second auxiliary amplifier, and the flipflop provides an output signal on the output side, which output signal can be supplied to the first or second detector; and
  a second measurement switch, which is controllable by means of the output signal in such a way that the second measurement switch connects either a first or second constant current source electrically conductively to inputs of the first and second auxiliary amplifier and couples to the first or second electrode.

11. A sensor arrangement, in particular for contactless measurement, comprising:
  a signal generator, which is connected to a first electrode;
  a first detector, which is connected to the first electrode, and which is designed to measure a first signal and for a capacitive measurement by means of the first electrode; and
  a second detector, which is connected to a second electrode, and which is designed to measure a second signal and to perform a capacitive measurement by means of the first and second electrodes,
  wherein the first or second detector is/are coupled to a charge measurement apparatus,
  wherein the charge measurement apparatus provides the first or second signal,
  wherein the charge measurement apparatus comprises:
    a flipflop, which is connected on the input side to a first and a second auxiliary amplifier, wherein a first measurement reference is present at the first auxiliary amplifier and a second measurement reference is present at the second auxiliary amplifier, and the flipflop provides an output signal on the output side, which output signal can be supplied to the first or second detector;
    a second measurement switch, which is controllable by means of the output signal in such a way that the second measurement switch connects either a first or second constant current source electrically conductively to inputs of the first and second auxiliary amplifier and couples to the first or second electrode;
    a phase-locked loop, to which the output signal and a control reference can be supplied and which provides a closed-loop control signal, which can be supplied to the first or second detector; and
    first and second adjustable current sources whose respective current intensity can be adjusted by means of the closed-loop control signal.

12. A method for operating a sensor arrangement, in particular for contactless measurement, comprising:
  providing, by a signal generator connected to a first electrode, a signal current;
  implementing, by a first detector designed to measure a first signal and connected to the first electrode, a first capacitive measurement by the first electrode with respect to a ground potential;
  implementing, by a second detector designed to measure a second signal and connected to a second electrode, a second capacitive measurement by the first electrode and the second electrode,
  wherein the first electrode is connected to the first detector and the signal generator by a first switch,
  wherein the signal generator is connected to the second detector by a second switch, and
  wherein the second detector has a further detection amplifier, to which the second signal and a third reference signal can be supplied, and which detection amplifier provides a third detection signal depending on the second signal and the third reference signal.

13. The method according to claim 12, wherein the first signal is measured by a first detection path, which first signal is indicative of a capacitive coupling of an object to the first electrode, and
  wherein a second signal is measured by a second detection path, which second signal is indicative of a capacitive coupling of the object to the first and second electrode.

14. The method according to claim 12 or 13, wherein the results of the first and second capacitive measurement are used for mutual calibration.

* * * * *